United States Patent [19]

Vora et al.

[11] Patent Number: 4,622,575
[45] Date of Patent: Nov. 11, 1986

[54] INTEGRATED CIRCUIT BIPOLAR MEMORY CELL

[75] Inventors: Madhukar B. Vora, Los Gatos; William H. Herndon, Sunnyvale, both of Calif.

[73] Assignee: Fairchild Semiconductor Corporation, Cupertino, Calif.

[21] Appl. No.: 647,315

[22] Filed: Sep. 4, 1984

Related U.S. Application Data

[62] Division of Ser. No. 315,678, Oct. 27, 1981.

[51] Int. Cl.⁴ .................... H01L 29/04; H01L 27/02; H01L 29/70
[52] U.S. Cl. ........................................ 357/59; 357/44; 357/86; 357/34; 365/175; 365/156; 365/181
[58] Field of Search ................ 357/44, 86, 59, 34; 365/175, 156, 181

[56] References Cited

U.S. PATENT DOCUMENTS

| | | | |
|---|---|---|---|
| 4,322,821 | 3/1982 | Lohstroh et al. | 357/59 |
| 4,380,708 | 4/1983 | Hart | 357/59 |
| 4,398,338 | 8/1983 | Tickle et al. | 357/23.5 |
| 4,412,239 | 10/1983 | Iwasaki et al. | 357/44 |
| 4,512,075 | 4/1985 | Vora | 357/59 |

FOREIGN PATENT DOCUMENTS

| | | | |
|---|---|---|---|
| 54-107280 | 8/1979 | Japan | 357/59 |
| 2014785 | 8/1979 | United Kingdom | |

OTHER PUBLICATIONS

Okada et al, "PSA ... LSI", *IEEE J. of Solid State Cir.*, Vol. Sc-13, No. 5, Oct. 1978, pp. 693-697.
IBM Technical Disclosure, vol. 22, No. 7, Dec. 1979, pp. 2786-2788, N.Y., US: H. H. Berger et al: "Double Polysilicon MTL Structure".
IBM Technical Disclosure, vol. 21, No. 12, May 1979, p. 4886, N.Y., US: H. H. Berger: "Cross-Coupled Flip-Flop Transistors with Stacked Interconnection Lines".

Primary Examiner—Martin H. Edlow
Assistant Examiner—Jerome Jackson, Jr.
Attorney, Agent, or Firm—David H. Carroll; Carl L. Silverman; Robert C. Colwell

[57] ABSTRACT

A static bipolar random access memory cell includes first and second transistors formed in epitaxial silicon pockets 41 and 42 in a substrate. The collectors 19 and 19' and bases 15 and 15' of the transistors are interconnected with polycrystalline silicon 21 doped to match the conductivity types of the regions contacted. Undesired PN junctions 40 and 40' created thereby are shorted using an overlying layer of a metal silicide 25. In a region overlying the N conductivity type polycrystalline silicon 23 or 23', the metal silicide is removed and a PH junction 37 or 37' created by depositing P conductivity type polycrystalline silicon 35c or 35c'. If desired additional P type polycrystalline silicon 35a and 35b may be deposited across the surface of the epitaxial layer where the base regions of the two transistors are formed to reduce the base series resistance.

14 Claims, 11 Drawing Figures

INTEGRATED CIRCUIT BIPOLAR MEMORY CELL

This is a division of application Ser. No. 315,678, filed 10/27/81.

BACKGROUND OF THE INVENTION

1. Field of the Invention

This invention relates to integrated circuits, and in particular to a bit line powered bipolar memory cell in which polycrystalline silicon diodes are used.

2. Description of the Prior Art

Bit line powered bipolar memory cells are known in the art. For example, William Herndon, one of the inventors of this invention, in U.S. Pat. No. 4,032,902 entitled "Semiconductor Memory Cell Circuit and Structure" teaches fabrication of a bit line powered bipolar memory cell having four transistors. Jan Lohstroh, in "Static Bipolar RAM Cell With Compact Punch-Through Loads", *Digest of Technical Papers*, 1979, IEEE International Solid-State Circuits Conference, pages 14 and 15 teaches fabrication of a static bipolar memory cell having nonlinear load devices such as punch-through diodes. The Lohstroh circuit, however, uses punch-through diodes and requires an unusual power source supply. The use of punch-through diodes is disadvantageous because large power supply voltages are required. The use of the unusual power supply precludes application of the memory cell in many otherwise desirable applications.

SUMMARY OF THE INVENTION

This invention provides an unusually compact bit line powered bipolar memory cell in which diodes are used as load devices. Using 2 micron layout rules the memory cell of this invention occupies an area in an integrated circuit of approximately 112 square microns. The unusually small size of such a cell thereby enables one to fabricate 256,000 bit random access memories on a reasonable sized chip.

In one embodiment the integrated circuit structure of this invention comprises a semiconductor substrate having a surface, a first and a second transistor structure, each having a first region of first conductivity type and a second region of opposite conductivity type adjacent the surface of the substrate, a first and a second connection of semiconductor material disposed on the surface of the substrate, each extending between a first conductivity type region in one of the first and second transistors and an opposite conductivity type region in the other of the first and second transistors, separate portions of each of the first and the second connections being of conductivity type corresponding to the conductivity type of the first or the second region beneath the connection, a layer of electrically conductive material disposed on a first portion of each of the first and second connections to electrically connect the separate portions of the connection, a first PN junction formed between a second portion of the first connection and a first overlying region of oppositely doped semiconductor material, and a second PN junction formed between the second portion of the second connection and a second overlying region of oppositely doped semiconductor material.

In the preferred embodiment the first and second transistor structures are formed in separate pockets of epitaxial silicon and utilize a common buried layer for the emitters of each of the transistors. The first and second connections are typically doped polycrystalline silicon which serves as a source of impurity dopants to dope the base contact and the collector of each of the first and second transistors. A layer of a refractory metal silicide, for example, tantalum silicide, is disposed across each of the first and second connections to electrically connect the P and N conductivity type portions of each connection to each other. A diode for each of the cross-coupled bases and collectors of the first and second transistor structures is formed by a region of polycrystalline silicon deposited on a region of each of the first and second connections.

BRIEF DESCRIPTION OF THE DRAWINGS

FIG. 3b is a cross-sectional view of a portion of the structure shown in FIG. 3a.

DESCRIPTION OF THE PREFERRED EMBODIMENTS

Figure 1:
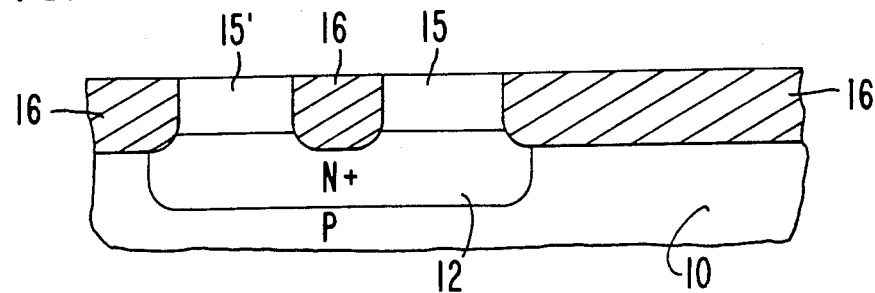
FIG. 1 is a cross sectional view of an integrated circuit structure from which this invention may be fabricated.

FIG. 1 illustrates a cross-sectional view of a semiconductor structure including a P conductivity type silicon substrate 10, an N conductivity type buried layer 12, intrinsic epitaxial silicon layer 15 divided into regions 15 and 15', and silicon dioxide insulation 16. In the preferred embodiment of this invention substrate 10 will have a resistivity of 2 ohm-centimeters while buried layer 12 will be doped with N conductivity type impurities to a concentration of $10^{19}$ atoms per cubic centimeter. The structure shown in FIG. 1 may be fabricated using wellknown semiconductor fabrication techniques, for example, as taught by Douglas-Peltzer in U.S. Pat. No. 3,648,125 entitled "Method of Fabricating Integrated Circuits With Oxidized Isolation and the Resulting Structure."

Figure 2:
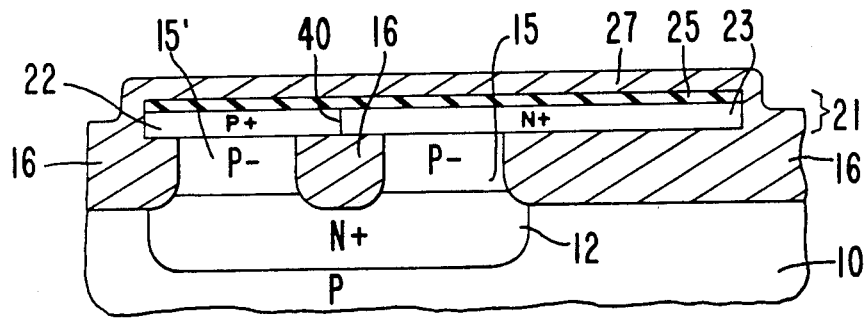
FIG. 2 is a subsequent cross-sectional view after formation of a layer of metal silicide and a layer of polycrystalline silicon.

As shown by FIG. 2, epitaxial layer 15 is then doped with a suitable P conductivity type impurity, such as boron, to a concentration of $5 \times 10^{16}$ atoms per cubic centimeter. As will be explained, the lightly doped P type region 15 will serve as the intrinsic base for subsequently formed NPN transistors. Layer 15 may be most readily doped by implanting boron ions into the epitaxial layer using a dose of $10^{13}$ atoms per square centimeter and an implant energy of 150 kev.

Once epitaxial layer 15 is suitably doped, a layer of polycrystalline silicon 21 approximately 5000 Angstroms thick is deposited across the upper surface of the structure, for example, using chemical vapor deposition. The polycrystalline silicon 21 is then masked using well-known techniques and N and P conductivity type impurities introduced as depicted in FIG. 2. The N type portion 23 of layer 21 will be doped to a concentration of approximately $10^{20}$ atoms per cubic centimeter of arsenic, while the P type portion 22 of layer 21 will be doped with approximately $10^{19}$ atoms per cubic centimeter of boron. A PN junction 40 is thereby created in layer 21.

Figure 3A:
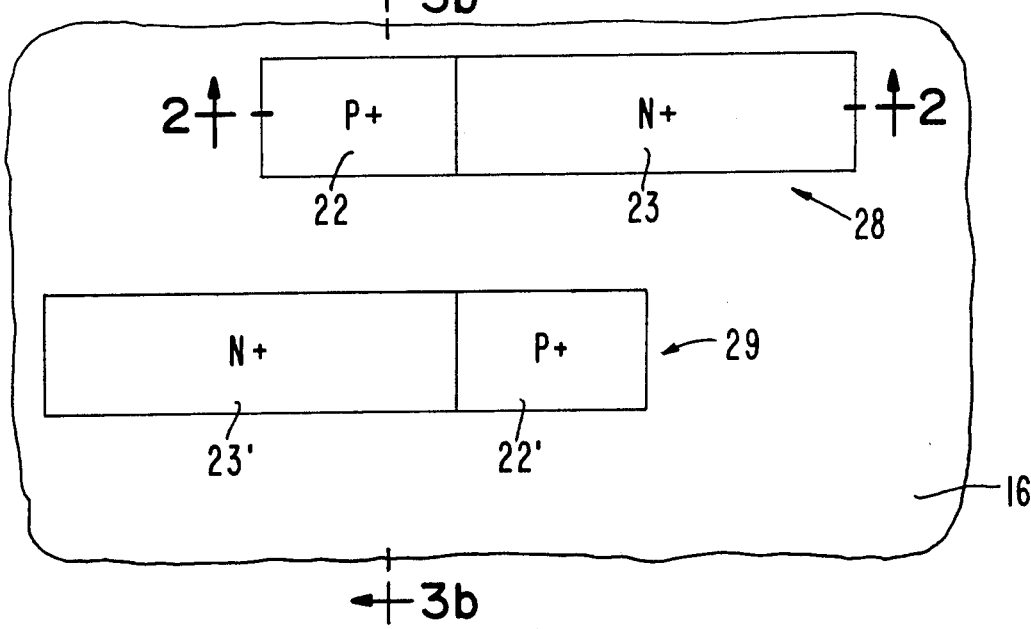
FIG. 3a is a top view of the structure shown in FIG. 2.
Figure 3B:
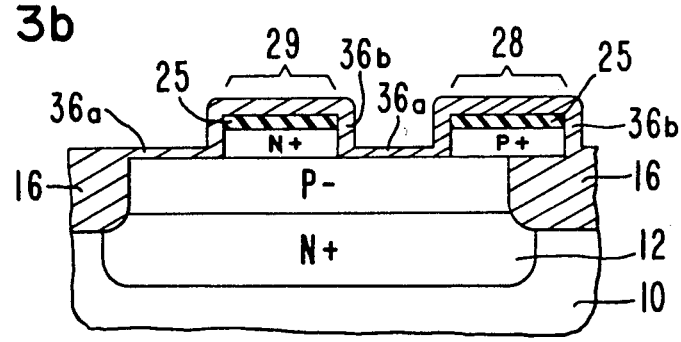

At the same time the regions 22 and 23 are doped, other portions of layer 21 in front of the cross-section shown in FIG. 2 are also doped. These regions 22' and 23' are shown in FIG. 3a, and as shown, region 23' will be doped with an opposite conductivity type to region 22 and region 22' will be doped with opposite conductivity to region 23. The function of opposite conductivity type regions 22' and 23' is discussed in conjunction with FIG. 7. The precise location of the PN junction between regions 22 and 23' and between 22' and 23 is not critical because this junction is later removed. Moreover, only those portions of layer 21 which are not subsequently removed need be doped. As shown by FIG. 3a and 3b only two strips of layer 21 remain after subsequent process steps and these are the only portions of layer 21 which need be doped.

Across the upper surface of polycrystalline silicon 21, a layer of metal silicide 25 is formed. In the preferred embodiment silicide layer 25 comprises a refractory metal silicide, such as tantalum silicide or tungsten silicide, approximately 1000 Angstroms thick which is fabricated by chemical vapor deposition. On the upper surface of silicide layer 25 a layer of silicon dioxide 27 approximately 3000 Angstroms thick is fabricated by heating silicide 29 to a temperature of 800° C. for 3 hours in a steam ambient. Silicide 25 will "short" P-N junction 40 created in polycrystalline silicon 25. Oxide 27 will protect silicide 29 from subsequent processing steps which are described in conjunction with FIGS. 4 and 5.

The structure in FIG. 2 is then masked and etched using known photolithographic and chemical or plasma etching techniques to define strips 28 and 29 comprising polycrystalline silicon together with overlying silicide 25 and silicon dioxide 27. FIG. 3a is a top view of strips 28 and 29. The strips 28 and 29 may be defined using any desired technique, for example, etching with a plasma which comprises carbon tetrafluoride to etch oxide 27, and carbon tetrachloride to etch silicide 25 and polycrystalline silicon 22 and 23.

As shown in FIG. 3b after definition of strips 28 and 29, the resulting integrated circuit structure is heated to a temperature of 800° C. for 3 hours in steam. In this manner a layer of silicon dioxide 36 will be formed across the surface of epitaxial layer 15 and on the sides of strips 28 and 29. The silicon dioxide 36 on the upper surface of the strips 28 and 29 will become thicker. Because the heavily doped polycrystalline silicon regions 22, 23, 22' and 23' will oxidize faster than the lightly doped region 15, a thicker layer of silicon dioxide 36b will form on the sides of strips 28 and 29 than layer 36a on the surface of epitaxial layer 15. In the preferred embodiment layer 36b will be approximately 1500 Angstroms thick while layer 36a will be approximately 500 Angstroms thick.

Figure 4:
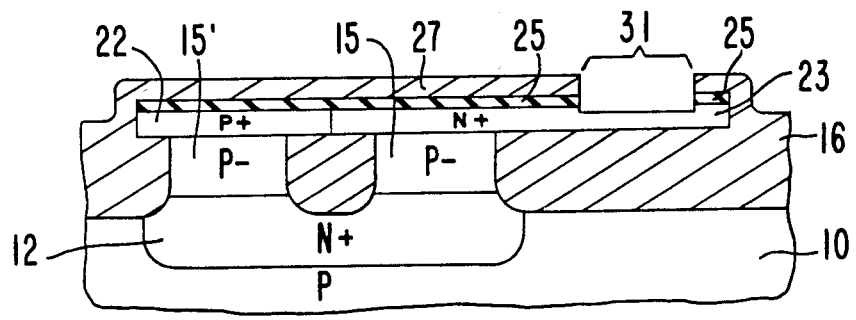
FIG. 4 is a subsequent cross-sectional view of the integrated circuit structure of FIG. 1 after removal of portions of metal silicide and doped polycrystalline silicon.

An opening 31 (see FIG. 4) is next made in a desired location through at least all of silicon dioxide layer 27 and all of metal silicide layer 25. In the preferred embodiment the desired location for opening 31 is over a portion of N conductivity type polycrystalline silicon 23 and silicon dioxide region 16. Opening 31 may be made using well-known photolithographic processes in conjunction with chemical or plasma etching. In the preferred embodiment a plasma containing carbon tetrafluoride (CF$_4$) is used to etch through layer 27, followed by etching through layer 25 with a plasma containing carbon tetrachloride (CCl$_4$). As also shown in FIG. 4, to assure that all of the metal silicide layer 25 is removed from within opening 31, the plasma etching process is allowed to continue for a slightly longer time than otherwise necessary. This results in a slight etching of the underlying polycrystalline silicon layer 23, and thereby assures that material subsequently deposited in opening 31 will contact polycrystalline silicon 23, and not any remnants of silicide 25.

A layer of silicon dioxide is formed over the edges of metal silicide 25 in opening 31, and although not shown, across the bottom of opening 31. An anisotropic etching process, for example, plasma etching using carbon tetrafluoride (CF$_4$), is then employed to remove the silicon dioxide layer from the bottom of opening 31. To prevent subsequently deposited layers from forming electrical connections to silicide 15, the silicon dioxide 18 on the edges of layer 15 is not removed. This etching also removes the thin oxide 36a (see FIG. 3b) on the surface of epitaxial layer 15. Because of the different thicknesses of layers 36a and 36b some of layer 36b will remain on the sides of polycrystalline silicon strips 28 and 29 after all of layer 36a is removed. The oxide 36b which remains on the sides of the polycrystalline silicon regions 28 and 29 and oxide 27 on top silicide 25 will electrically isolate these regions from subsequently formed layers overlying the strips 28 and 29.

A relatively thick layer of polycrystalline silicon 35 is deposited across the surface of the structure. In the preferred embodiment polycrystalline silicon layer 35 is on the order of 6,000 Angstroms thick and is deposited using chemical vapor deposition. Polycrystalline silicon layer 35 is doped with P conductivity type impurity, for example, boron, to an impurity concentration of $10^{19}$ atoms per cubic centimeter. Layer 35 may be doped at the same time it is deposited, or may be doped after deposition using diffusion or ion implantation processes.

Figure 5:
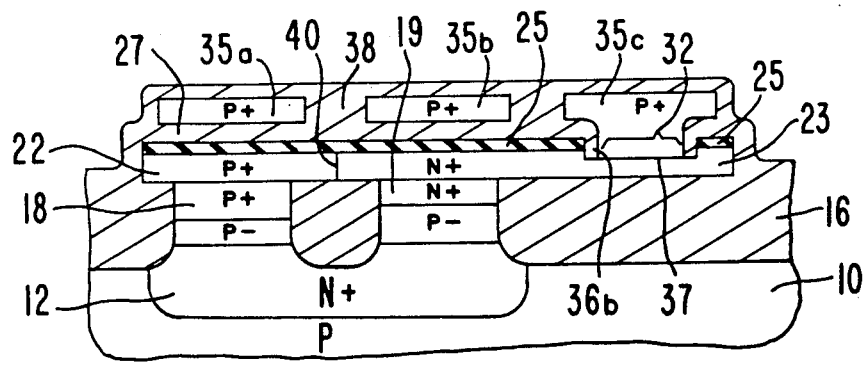
FIG. 5 is a subsequent cross-sectional view after formation of a subsequent layer of doped polycrystalline silicon to form the diode load devices.

After deposition, and using well known photolithographic techniques, layer 35 is divided into regions 35a, 35b and 35c. These regions are shown in FIG. 5. Regions 35a and 35b of doped polycrystalline silicon serve to lower the base resistance of the NPN transistors formed in the epitaxial silicon pockets of the substrate. Polycrystalline silicon region 35c creates a PN junction 37 with layer 23. This diode is connected via doped polycrystalline silicon region 23 to the collector 19 of one of the NPN transistors formed in the substrate.

Figure 6:
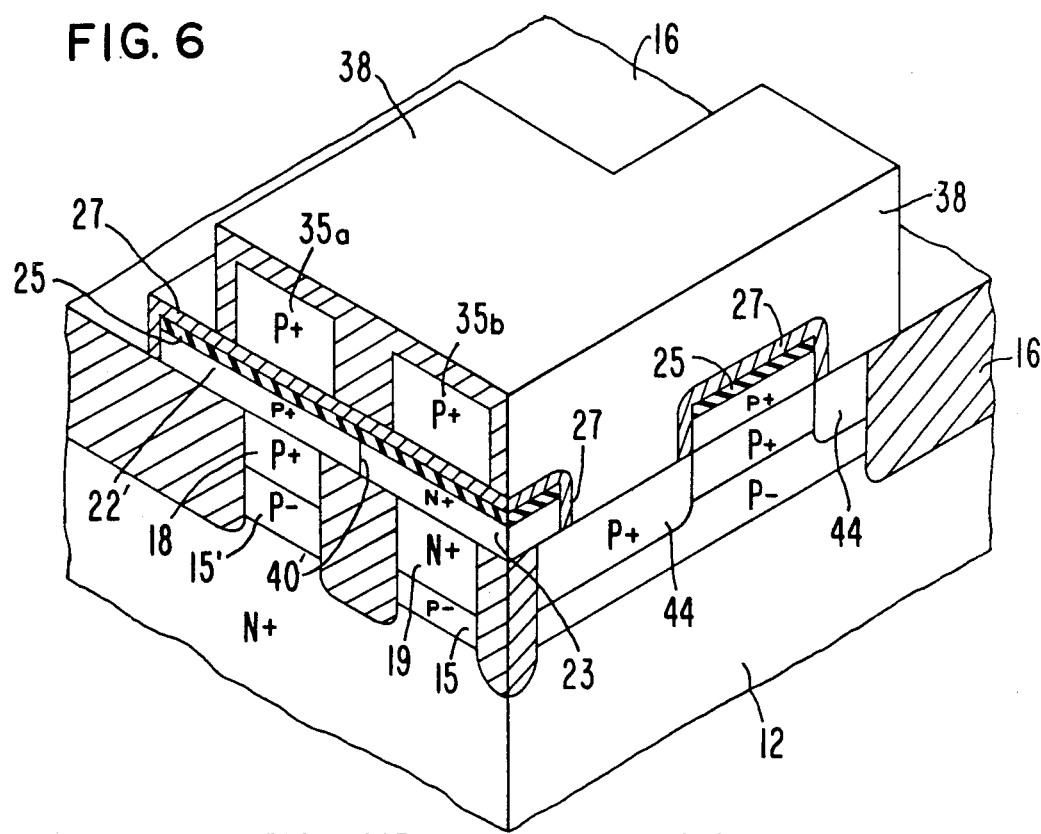
FIG. 6 is a perspective view of a portion of the structure shown in FIG. 5.

The resulting structure is then oxidized by heating it to a temperature of 1000° C. for 1 hour to create silicon dioxide layer 38. During this relatively long thermal process, N conductivity type impurity from polycrystalline silicon 23 will diffuse into epitaxial layer 15 to create N type region 19. At the same time P conductivity type impurity from both polycrystalline silicon 22 and 35 will diffuse into epitaxial silicon 15 to create P conductivity type regions 18 and 44. N type region 19 comprises the collector of an inverted NPN transistor having emitter 12 and base 15. The P conductivity type dopant 44 in the upper portions of epitaxial silicon 15 outside of collector 42 lowers the resistance of the P type base 15. The resulting integrated circuit structure is shown in perspective in FIG. 6.

Figure 7:
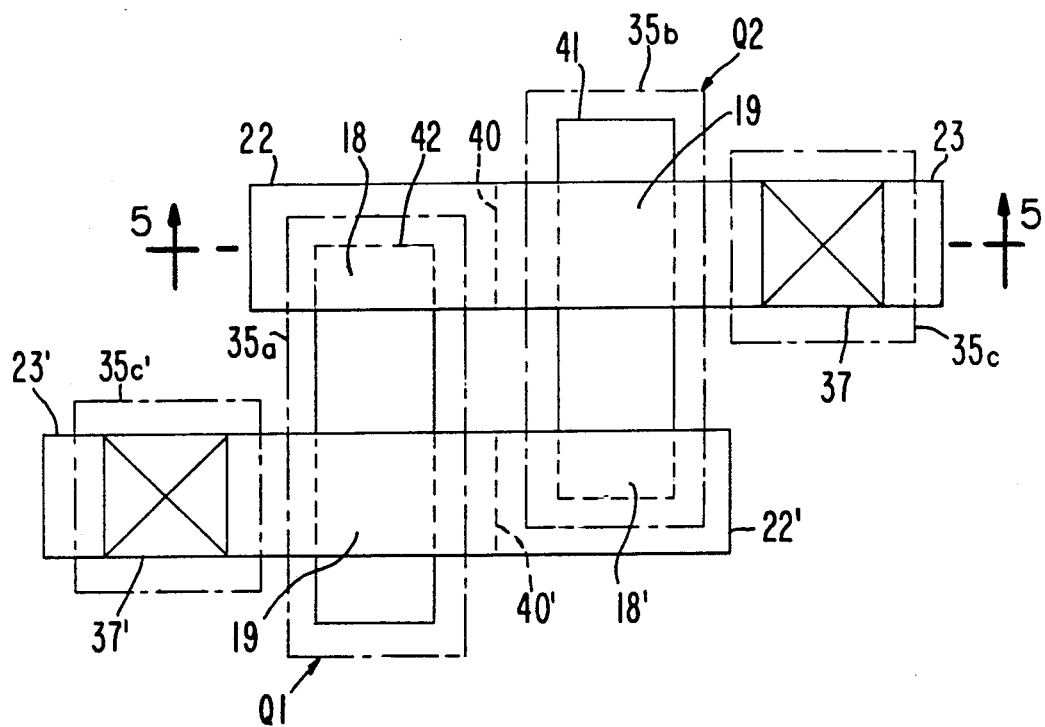
FIG. 7 is a top view of the structure shown in FIG. 5.

FIG. 7 is a top view of the structure shown in cross-section in FIG. 5. Regions in FIG. 7 are given the same numerical designation as in FIG. 5. In FIG. 7 regions 41 and 42 are the epitaxial silicon pockets in which the transistor structures are formed. Pockets 41 and 42 are electrically isolated from each other by surrounding silicon dioxide isolation regions. Region 22 is P conductivity type doped polycrystalline silicon and region 23 is N conductivity type doped polycrystalline silicon. A PN junction 40 resulting from the conductivity types of regions 22 and 23 is shown. This junction is short circuited by the aforementioned silicide 25. Region 35c' is the boundary of the P conductivity type polycrystalline silicon used in fabricating the diode comprising PN junction 37'. Region 18 is the base contact to the transistor formed in pocket 42, while region 19' is the collector of that transistor.

The other portion of FIG. 7 is similarly designated, with region 18' consisting of the base contact and region 19' of the collector contact for the transistor formed in pocket 41. PN junction 37 is created by polycrystalline silicon 35c deposited on polycrystalline silicon 23.

Figure 8:
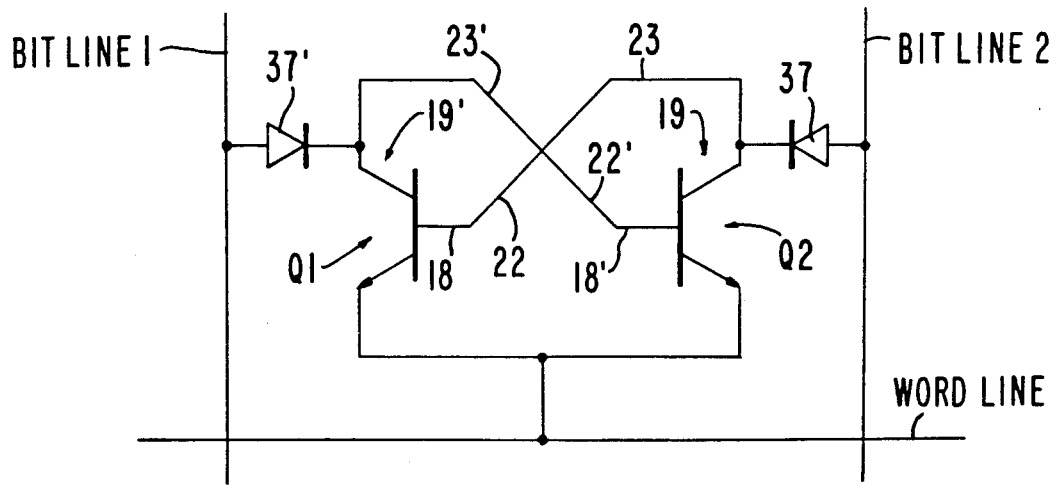
FIG. 8 is an equivalent electrical schematic of the structure shown in FIG. 6.

FIG. 8 is an electrical schematic of an equivalent discrete circuit created by the integrated circuit structure. As shown, diode 37 is connected to collector 19 of transistor Q2, while diode 37' is connected to collector 19' of transistor Q1. The base of transistor Q1 is coupled to the collector of transistor Q2 via doped polycrystalline silicon 22 and 23 and the metal silicide short circuiting the resulting PN junction. The base of transistor Q2 is coupled via doped polycrystalline 22' and 23', and metal silicide to the collector 19' of transistor Q1.

Figure 9:
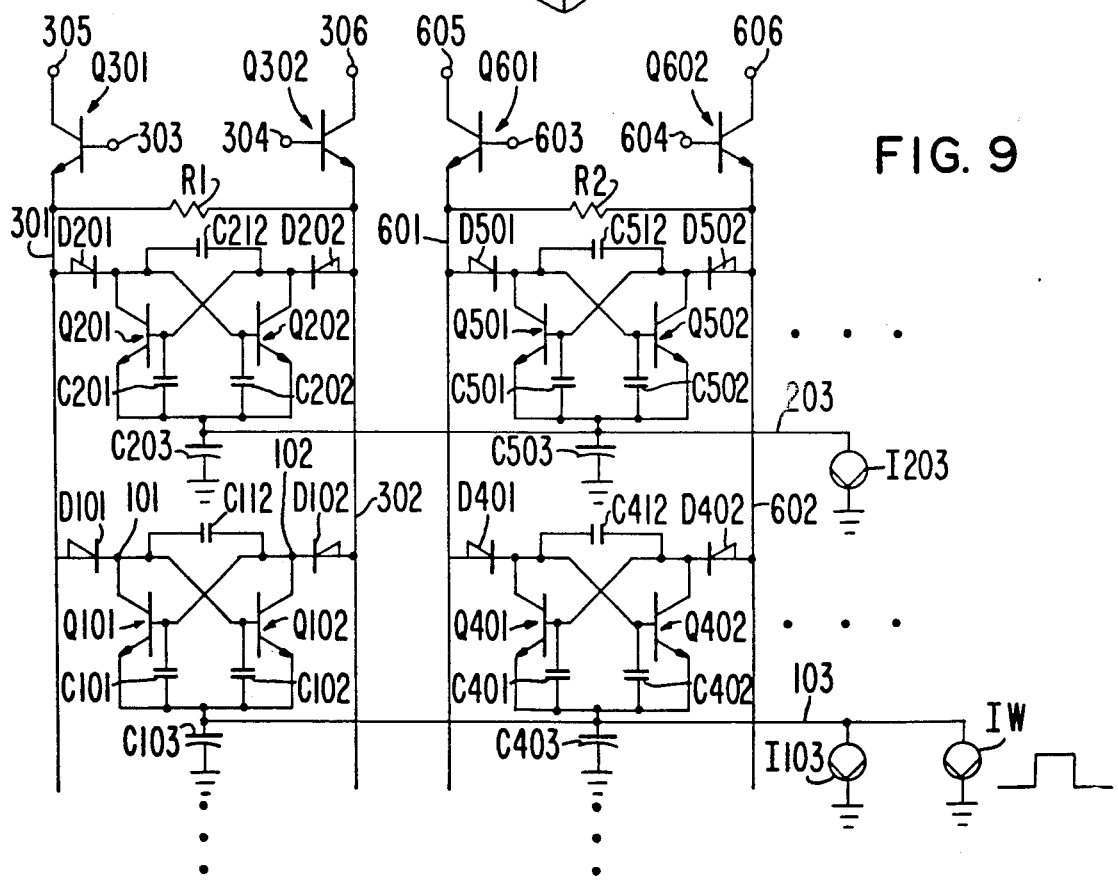
FIG. 9 is an electrical schematic of a plurality of memory cells interconnected.

FIG. 9 is an electrical schematic of a plurality of the bit line powered translinear memory cells of this invention interconnected to form a portion of a memory array. As shown in FIG. 9 a single memory cell is comprised of a cross-coupled pair of NPN transistors Q101 and Q102. A first diode D101 and a second diode D102 serve as loads for the cross-coupled transistors Q101 and Q102. In addition diodes D101 and D102 serves as a means for coupling the cell to the bit lines 301 and 302. As shown in FIG. 9 any desired number of such cells may also be coupled between bit lines 301 and 302 to form a column of memory cells. In FIG. 9 a second memory cell comprised of transistors Q201 and Q202 and diodes D201 and D202 is also coupled between the bit lines 301 and 302.

The commonly coupled emitters of the cross-coupled transistors Q1O1 and Q102 of each memory cell are coupled to a word line 103 as shown. In a similar manner the emitters of other cells in the same column are coupled together and to other word lines such as word line 203. As many memory cells as desired may also be coupled to the same word line. For example, the memory cell comprised of transistors Q401 and Q402 is also coupled to word line 103. Additional cells may also be added. An array of memory cells is thereby formed having columns of cells coupled between bit lines and rows of cells coupled to word lines. In addition to sharing the bit lines, each column of cells shares the same sense amplifier Q301 and Q302, while each row of cells shares the same current source I103.

When fabricated in an integrated circuit embodiment, the memory cells will include parasitic capacitances which are also shown in FIG. 9. In prior art memory cells the parasitic capacitances hinder the operation of the cell and are typically viewed as undesirable. It is a feature of this invention, however, that the parasitic capacitances created in an integrated circuit embodiment of the memory array of FIG. 9 are utilized in the operation of the memory cell. These parasitic capacitances are shown in conjunction with each of the cross-coupled pairs of NPN transistors and the load diodes. For example, each of the cross-coupled pair of the NPN transistors Q101 and Q102 includes a parasitic capacitance between the epitaxial layer which comprises the base of the each of the transistors and the buried layer which comprises the emitter of the each of the transistors. These base-emitter capacitances are designated C101 and C102 in FIG. 9, and typically each will be on the order of approximately 24 femtofarads. In addition, each transistor pair includes a collector-base capacitance, designated C112 in FIG. 9. Typically this capacitance is also on the order 24 femtofarads. The capacitance C112 is shown between the collectors of transistors Q101 and Q102 because the cross-coupled bases and collectors of the two transistors short the collector-base capacitance of each together and therefore this combined capacitance is representated as a single capacitances C112.

Each memory cell in an integrated circuit embodiment also will possess a capacitance between the buried layer forming the emitters of the cross-coupled transistor pair and the underlying semiconductor substrate. This capacitance is shown as C103 in FIG. 9, and will typically be on the order of 160 femtofarads. Similar base-emitter, collector-base, and buried layer-isolation capacitances are shown for each of the memory cells in FIG. 9.

In addition to the electronic components and parasitic capacitances described, each pair of bit lines 301 and 302 includes a resistor R1 coupled between the bit lines. The resistance of resistor R1 is made sufficiently small, for example, on the order of 1000 ohms, to maintain the voltage of line 302 at approximately the same level as line 301, even if all but one of the cells sharing the common bit lines are in a state such that current from the cells flows through bit line 302.

An individual cell within the memory array shown in FIG. 9 has three modes of operation—standby, read and write. These operations are described below. For the standby mode of operation the memory array is biased with only a standby current in all the word lines 103 and 203. This current will be on the order of 0.5 to 1 microamp. The standby current may be chosen to be as small as desired as long as the individual transistors in each cell maintain a reasonable gain. The potential applied to nodes 303, 304, 603, and 604 will be equal and approximately zero volts. These conditions will cause the cell current, which is the current flowing through the "on" transistor collector and through the diode and bit line connected to the "on" transistor, to be approximately equivalent in all cells. For example, if transistor Q102 is the "on" transistor of that memory cell and transistor Q501 is the "on" transistor of that memory cell, the currents flowing through transistor Q102 and diode D102 to bit line 302 will be approximately equal to the current flowing through the transistor Q501 and diode D501 to bit line 601. Resistor values R1 and R2 are sufficiently small to maintain the potential of bit lines 301, 302, 601, and 602 at approximately the same level.

Reading of an individual cell within the memory array is accomplished by pulsing a current IW into the addressed word line 103. In the reading operation all cells connected to the addressed word line are read at the same time, with the pairs of bit lines being used to select the individual cells desired. For example, if the cell comprised of transistors Q101 and Q102 is to be read, a current IW will be applied to word line 103. This causes reading of all cells connected to that word line, however, the individual cell desired is isolated by sensing the current into nodes 305 and 306.

Application of the reading current IW to the word line 103 causes the word line current to be split among all the cells sharing the word line. Cell current flows through the "on" transistor of each cell connected to the word line 103, and through the diode associated with that "on" transistor into the bit line connected to the diode. For example, if Q101 and Q402 are on, current will flow into bit lines 301 and 602. The word line current is made sufficiently large, for example, on the order of 200 microamps, to generate a current difference between the sense amplifier transistors Q301 and Q302 that will overcome the standby current of the cells which are not addressed but also connected to the same bit line pair 301 and 302. This current difference between transistors Q301 and Q302 is used to drive well known output amplifiers coupled to nodes 305 and 306 to read the data of the addressed cells. During the read operation the current increase through the sense amplifier transistors Q301 and Q302 causes the voltage of lines 301 and 302 to become more negative. This causes the forward bias of the non-addressed cells connected to the bit lines 301 and 302 to be reduced and thereby reduces the current flowing into the other cells coupled to these bit lines. The state of the data in each of the non-addressed cells is maintained because the standby current before and after the read pulse IW is insufficient to discharge the capacitances C201, C202, and C212 associated with the non-addressed cells during the time of the read pulse IW.

Writing data into an individual cell is accomplished by application of appropriate potentials to one of the pair of bit lines and the corresponding word line associated with that cell. Data may be written into the cell comprised of Q101 and Q102 while the large addressed cell word current IW is flowing. For example, if Q101 is the "on" transistor and the voltage at the base 304 of transistor Q302 is reduced while the voltage at the base 303 of transistor Q301 is left at the positive read level, then there is no path for the base current flowing through diode D102 to keep transistor Q101 on. When the current through D101 charges C102 sufficiently, transistor Q102 will be turned on. Cells that are not addressed but share the same bit line pairs are not affected during the write operation because the standby current during the write operation is insufficient to reduce the cell voltage levels during the write pulse IW. The forward bias across the coupling diodes D201 and D202 of non-addressed cells is reduced to effectively disconnect the non-addressed cells from the bit lines.

The memory cell described above offers numerous advantages over prior art static random access memory cells. In particular, individual memory cells do not require resistors. In an integrated circuit embodiment of the memory cells, this feature allows the size of the individual cells to be reduced as advances in semiconductor fabrication technology are made. The individual cells have a small logic swing on the order of 120 millivolts which allows very high speed operation of the memory array. Because each cell comprises only two transistors and two diodes, cells may be made smaller than cells of prior art memory arrays having a larger number of components. Because the cell deaddressed condition is the same as the condition when the power to all peripheral circuits is eliminated only a small amount of power is required to maintain the state of the data in the memory array.

Figure 10:
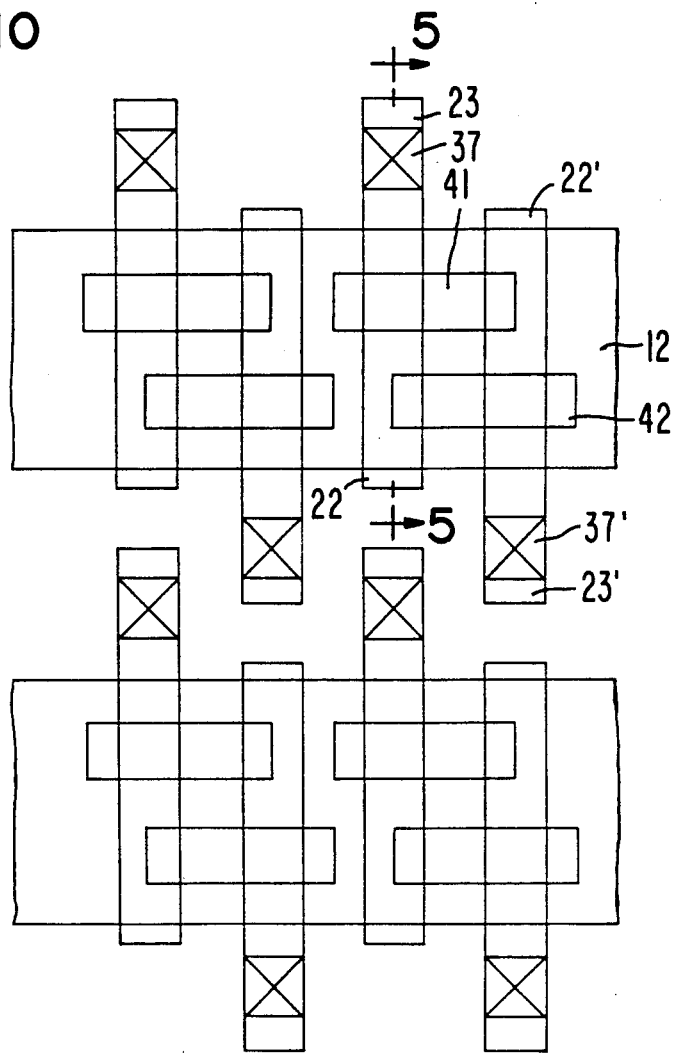
FIG. 10 is a top view of a plurality of memory cells fabricated in an integrated circuit embodiment.

FIG. 10 is a top view of an integrated circuit structure showing a combination of four of the memory cells of this invention. FIG. 10 illustrates how the buried layer 12 functions as a word line for all the cells disposed over it. Pairs of bit lines may be defined and deposited across the topography shown in FIG. 10 to interconnect the individual cells.

The static bipolar memory cell described in FIGS. 1–10 provides several advantages over prior art memory cells. Because of the small number of components required for each cell, that is, two transistors and two diodes, and the compact arrangement of the cell, it may be fabricated in an exceptionally small area. This allows the fabrication of large dense memories on conventional size integrated circuits. Because the buried layer functions as a word line, only a single layer of metal is needed to define the bit lines. The very compact nature of the individual transistors allows the cell to have very low capacitance and operate at high speeds. The fabrication of the diode loads over the field oxidation regions makes the isolation capacitance of the diodes negligible.

Although one embodiment of the memory cell of this invention has been described above, this embodiment is intended to be illustrative of the invention rather than limiting it. The scope of the invention is more readily defined by the appended claims.

What is claimed is:

1. A memory cell comprising:
   a semiconductor body including first and second bipolar transistors, each transistor including a base, a collector, and an emitter;
   the base of the first transistor being connected by a first connection to the collector of the second transistor and the collector of the first transistor being connected by a second connection to the base of the second transistor, the first and second connections including first and second spaced-apart strips of semiconductor material disposed on the semiconductor body;
   third and fourth spaced-apart strips of semiconductor material disposed across the first and second strips to contact the semiconductor body, but electrically isolated from the first and second strips; and
   first and second diode regions of semiconductor material disposed on selected portions of the respective first and second strips to contact the strips, the first and second diode regions being of opposite conductivity type to the selected portions of the first and second strips.

2. A memory cell as in claim 1 wherein the first and second strips of semiconductor material comprise polycrystalline silicon.

3. A memory cell as in claim 2 wherein the selected portions of the first and second strips are doped with N conductivity type impurity and the first and second diode regions of semiconductor material are doped with P conductivity type impurity.

4. A memory cell as in claim 2 wherein at least part of each of the first and second strips other than the selected portions is doped with P conductivity type impurity.

5. A memory cell as in claim 4 wherein each of the first and second strips includes a PN junction.

6. A memory cell as in claim 5 wherein each of the first and second strips further comprises a region of a metal silicide disposed across the PN junction to short circuit the PN junction.

7. A memory cell as in claim 6 wherein the metal silicide comprises a refractory metal silicide.

8. A memory cell as in claim 1 wherein each of the third and fourth spaced-apart strips of semiconductor material comprises polycrystalline silicon.

9. A memory cell as in claim 8 wherein each of the third and fourth spaced-apart strips are doped with P conductivity type impurity.

10. A memory cell as in claim 1 wherein the emitters of each of the first and second bipolar transistors comprise a buried layer in the semiconductor body.

11. A memory cell as in claim 10 wherein the semiconductor body further comprises an epitaxial layer disposed across the buried layer and divided into at least first and second pockets electrically isolated from each other by a region of oxidized semiconductor material extending into the semiconductor body to the buried layer.

12. A memory cell as in claim 11 wherein a portion of the epitaxial layer in the first pocket comprises the base of the first transistor, and a portion of the epitaxial layer in the second pocket comprises a base of the second transistor.

13. A memory cell as in claim 12 wherein the collector of the first transistor comprises a doped region extending into the epitaxial layer in the first pocket, and the collector of the second transistor comprises a doped region extending into the epitaxial layer in the second pocket.

14. An integrated bipolar memory cell including first and second cross-coupled transistors comprising:

a semiconductor substrate of first conductivity type, the substrate having a first surface;

a buried layer region of second conductivity type in the substrate adjacent the first surface, the buried layer providing commonly connected emitters for the first and second transistors;

a first and a second pocket of first conductivity type epitaxial semiconductor material disposed on at least the buried layer region, each pocket surrounded by insulating material, first portions of each of the first and second pockets adjacent the buried layer providing bases for the first and second transistors, respectively, and second portions of each of the first and second pockets providing base contacts to the respective bases;

first and second collector regions of second conductivity type disposed on the corresponding first portions of the respective pockets to thereby provide collectors for the first and second transistors, respectively;

first and second spaced-apart connections of semiconductor material disposed on at least the epitaxial semiconductor material, the first connection extending from the collector of the first transistor to the base contact of the second transistor, the second connection extending from the collector of the second transistor to the base contact of the first transistor, separate portions of each of the connections being of conductivity type corresponding to the conductivity type of the collector or base contact beneath that portion of the connection;

first and second shorting regions of electrically conductive material disposed on the corresponding connections to thereby electrically short the collector of the first transistor to the base contact of the second transistor, and the collector of the second transistor to the base contact of the first transistor;

first and second spaced-apart strips of first conductivity type semiconductor material disposed on at least the second portion of the respective first and second pockets; and first and second diode regions of first conductivity type semiconductor material disposed on the separate portions of the respective first and second connections, the separate portions being of conductivity type corresponding to the collectors of the respective first and second transistors.

* * * * *